(12) United States Patent
Watanabe (10) Patent No.: US 6,955,553 B2
(45) Date of Patent: Oct. 18, 2005

(54) NON-RECIPROCAL DEVICE

(75) Inventor: Yoshitsugu Watanabe, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/016,841

(22) Filed: Dec. 21, 2004

(65) Prior Publication Data

US 2005/0170679 A1 Aug. 4, 2005

(30) Foreign Application Priority Data

Dec. 22, 2003 (JP) .............................. 2003-425428

(51) Int. Cl.[7] ............................................ H01R 13/62
(52) U.S. Cl. ...................................... 439/259; 333/1.1
(58) Field of Search ............................... 439/259–265, 439/76.1, 76.2; 333/1.1

(56) References Cited

U.S. PATENT DOCUMENTS

| | | | |
|---|---|---|---|
| 4,390,853 A * | 6/1983 | Mathew et al. ............... | 333/1.1 |
| 6,317,010 B1 * | 11/2001 | Butland et al. ............... | 333/1.1 |
| 6,337,607 B1 | 1/2002 | Genfan ........................ | 333/1.1 |
| 6,696,901 B1 * | 2/2004 | Takeda et al. ................ | 333/1.1 |
| 6,783,374 B2 * | 8/2004 | Uratani et al. ................ | 439/83 |
| 2003/0226255 A1 * | 12/2003 | Sakai ........................... | 29/846 |
| 2004/0253867 A1 * | 12/2004 | Matsumoto ................. | 439/500 |

FOREIGN PATENT DOCUMENTS

| | | |
|---|---|---|
| JP | 10-294606 | 11/1998 |
| JP | 2003-124711 | 4/2003 |

* cited by examiner

Primary Examiner—Michael C. Zarroli
(74) Attorney, Agent, or Firm—Oblon, Spivak, McClelland, Maier & Neustadt, P.C.

(57) ABSTRACT

The present invention is directed to a non-reciprocal device which easily secures the same planarity in the bottom surfaces of the external terminals and the case bottom surface. The case 7 houses a circuit board 1 and a gyromagnetic component 2, such that the lower surface of the circuit board 1 faces the internal surface 711 of the bottom portion 71. A plurality of side walls 72 are arranged with a space 722 therebetween on the periphery of the bottom portion 71. External-terminal forming portions 11 to 13 of the circuit board 1 each protrude from the external side surface of the body 10 and are led to the outside of the case 7 through the space 722. The bottom surfaces of the thick portions 14 of the external-terminal forming portions 11 to 13 are formed on the same plane as the outer bottom surface 712 of the case 7. Connection electrodes 151 to 153 for center conductors are connected to the terminal portions 311 to 331 of the center conductors 31 to 33 inside the case 7. External terminal electrodes 156 are formed on the thick portions 14 and connected via the connection conductors 157 to the connection electrodes 151 to 153 for center conductors.

6 Claims, 12 Drawing Sheets

NON-RECIPROCAL DEVICE

TECHNICAL FIELD

The present invention relates to a non-reciprocal device such as an isolator, circulator, etc.

BACKGROUND OF THE INVENTION

A non-reciprocal device such as an isolator or circulator is incorporated, for example, in a mobile communication device such as a mobile telephone set or wireless device, or in a communication device used in the mobile communication base station. A typical non-reciprocal device comprises a gyromagnetic component formed of a soft ferrite body and a center electrode, a magnetic component such as a permanent magnet and electric components such as matching capacitors and terminal resistors, all housed in a magnetic metal case functioning as a yoke.

The center electrode is combined with the soft ferrite body, and to the assembly is applied a DC magnetic field by the permanent magnet. The center electrode comprises a plurality of terminal portions, and one end of it is placed on one surface of the soft ferrite body and is grounded to the metal case as a grounding portion. The terminal portions of the center conductor are formed so as to be arranged with a specified angle between each other. The fore-ends of the terminal portions are connected to said electric components and are led to the outside of the metal case to form external terminals.

By the way, a non-reciprocal device of this type is generally surface-mounted on and incorporated in the component-mounting board of the communication device. However, since the center conductor is formed of a very thin copper sheet or the like, it is difficult to properly position it as an external terminal as it is. Accordingly, terminal structures for securing the same planarity in the external terminals and the metal case have been proposed up to now.

For example, JP 2003-124,711A (Patent 1) discloses a non-reciprocal device having a terminal holding board with tab terminals fixed thereon. JP H10-294,606A (Patent 2) discloses a non-reciprocal device provided with a contact supporting member. U.S. Pat. No. 6,337,607B1 specification (Patent 3) discloses a structure in which terminals are formed by fitting a component-mounting board into each of the slots toward the inside of the case.

In the terminal structures of the conventional non-reciprocal devices, Patent 1 requires tab terminals and a terminal holding board, and Patent 2 requires contacts and a supporting member, and Patent 3 requires a plurality of component-mounting boards. Consequently, any of Patents 1 to 3 has a problem that the number of components and the man-hour for assembly are large.

SUMMARY OF THE INVENTION

An object of the present invention is to provide a non-reciprocal device which easily secures the same planarity in the bottom surfaces of the external terminals and the case bottom surface.

A further object of the present invention is to provide a non-reciprocal device which provides reduction in the number of components, improvement in the yield of assembly, and reduction in the man-hour and cost for assembly.

A still further object of the present invention is to provide a non-reciprocal device which has an external-terminal structure with high mechanical strength and reliable connection to the center conductor.

In order to achieve the objects described above, the non-reciprocal device according to the present invention comprises a gyromagnetic component, a case and a circuit board.

The gyromagnetic component comprises a soft ferrite body and a center conductor, the center conductor including a plurality of terminal portions and combined with the soft ferrite body.

The case comprises a bottom portion and a plurality of side walls, the side walls arranged with a space therebetween on the periphery of the bottom portion.

The circuit board comprises a body, a plurality of external-terminal forming portions and a plurality of conductor patterns. The body has a through-hole. Each external-terminal forming portion protrudes from the external side surface of the body and has a thick portion thicker than the body at the fore-end of the external-terminal forming portion.

Each conductor pattern includes a connection electrode for center conductor, the connection electrode formed on the upper surface of the body, an external terminal electrode formed on the surface of said thick portion, and a connection conductor connecting the connection electrode for center conductor and the external terminal electrode to each other.

The circuit board is placed inside the case so that the lower surface of the body of the circuit board is opposite to the internal surface of the bottom portion of the case and the external-terminal forming portions of the circuit board are led to the outside of the case through said spaces. The gyromagnetic component is arranged in the through-hole of the circuit board, the terminal portions of the center conductor being individually connected to the respective connection electrodes for center conductor.

In the non-reciprocal device according to the present invention, the case comprises a bottom portion and a plurality of side walls, the side walls arranged with a space therebetween on the periphery of the bottom portion. The circuit board comprises a plurality of external-terminal forming portions, each external-terminal forming portion protruding from the external side surface of the circuit board body and having a thick portion thicker than the circuit board body at the fore-end of the external-terminal forming portion. This circuit board is placed inside the case so that the lower surface of the circuit board body is opposite to the internal bottom surface of the case and the external-terminal forming portions of the circuit board are led to the outside of the case through the spaces between the side walls.

In this structure, the bottom surfaces of the external-terminal forming portions and the case bottom surface, at which the non-reciprocal device is mounted on printed patterns or the like, are positioned in the same plane by controlling only the thickness tolerances of the external-terminal forming portions and the case. Consequently, stable and easy surface-mounting on printed patterns or the like is achieved.

The circuit board comprises a plurality of conductor patterns, each conductor pattern including a connection electrode for center conductor, the connection electrode formed on the upper surface of the body, an external terminal electrode formed on the surface of said thick portion, and a connection conductor connecting the connection electrode for center conductor and the external terminal electrode to each other. In addition, the body of the circuit board has a through-hole, and the gyromagnetic component is placed inside the through-hole of the circuit board, and the terminal portions of the center conductor are individually connected to the respective connection electrodes for center conductor.

In the configuration described above, the center conductor of the gyromagnetic component is led outside through the conductor patterns of the circuit board.

And, only the circuit board is required as an additional component. Therefore, reduction in the number of components, improvement in the yield of assembly, and reduction in the man-hour and cost for assembly are achieved.

Furthermore, the circuit board is fabricated to have high rigidity, so that the external-terminal forming portions of the circuit board has high mechanical strength. This reduces the risk of the external terminals deformed by mechanical stress in manufacturing, carrying, handling and mounting the non-reciprocal device. Also, this point is effective for securing the same planarity in the bottom surfaces of the external terminals and the case bottom surface.

And, since the connection portions of the center conductor are arranged inside the case and far from the external terminals, there is an advantage of avoiding the mechanical stress transmission to the connection portions of the center conductor. Consequently, an external-terminal structure with high mechanical strength and reliable connection to the center conductor is achieved by the present invention.

As described above, the present invention provides the following effects:

(a) A non-reciprocal device is provided which easily secures the same planarity in the bottom surfaces of the external terminals and the case bottom surface.

(b) A non-reciprocal device is provided which provides reduction in the number of components, improvement in the yield of assembly, and reduction in the man-hour and cost for assembly.

(c) A non-reciprocal device is provided which has an external-terminal structure with high mechanical strength and reliable connection to the center conductor.

Other objects, configurations and advantages of the present invention are described in more detail with reference to the accompanying drawings. However, the accompanying drawings are only exemplary.

DESCRIPTION OF THE PREFERRED EMBODIMENTS

Figure 1:
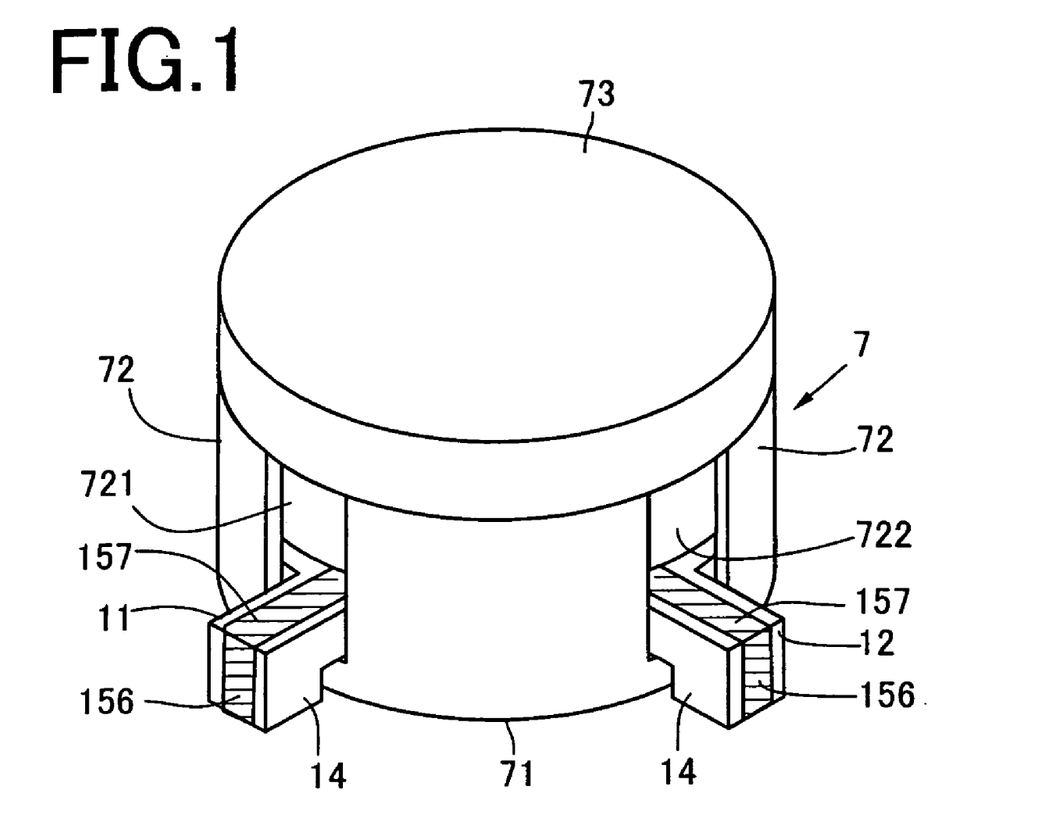
FIG. 1 is a perspective view showing an embodiment of a non-reciprocal device according to the present invention.
Figure 2:
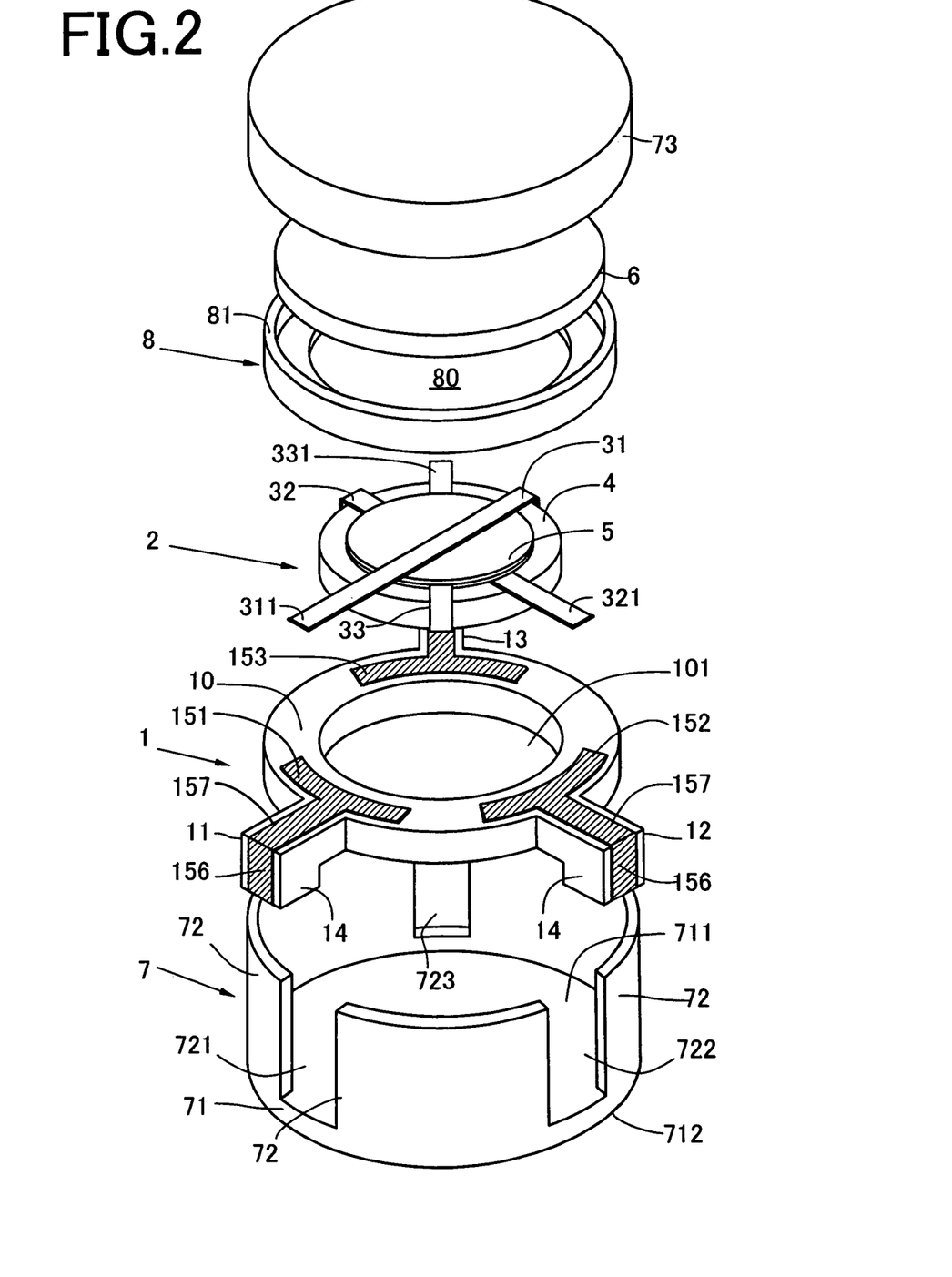
FIG. 2 is an exploded perspective view showing the non-reciprocal device shown in FIG. 1.
Figure 3:
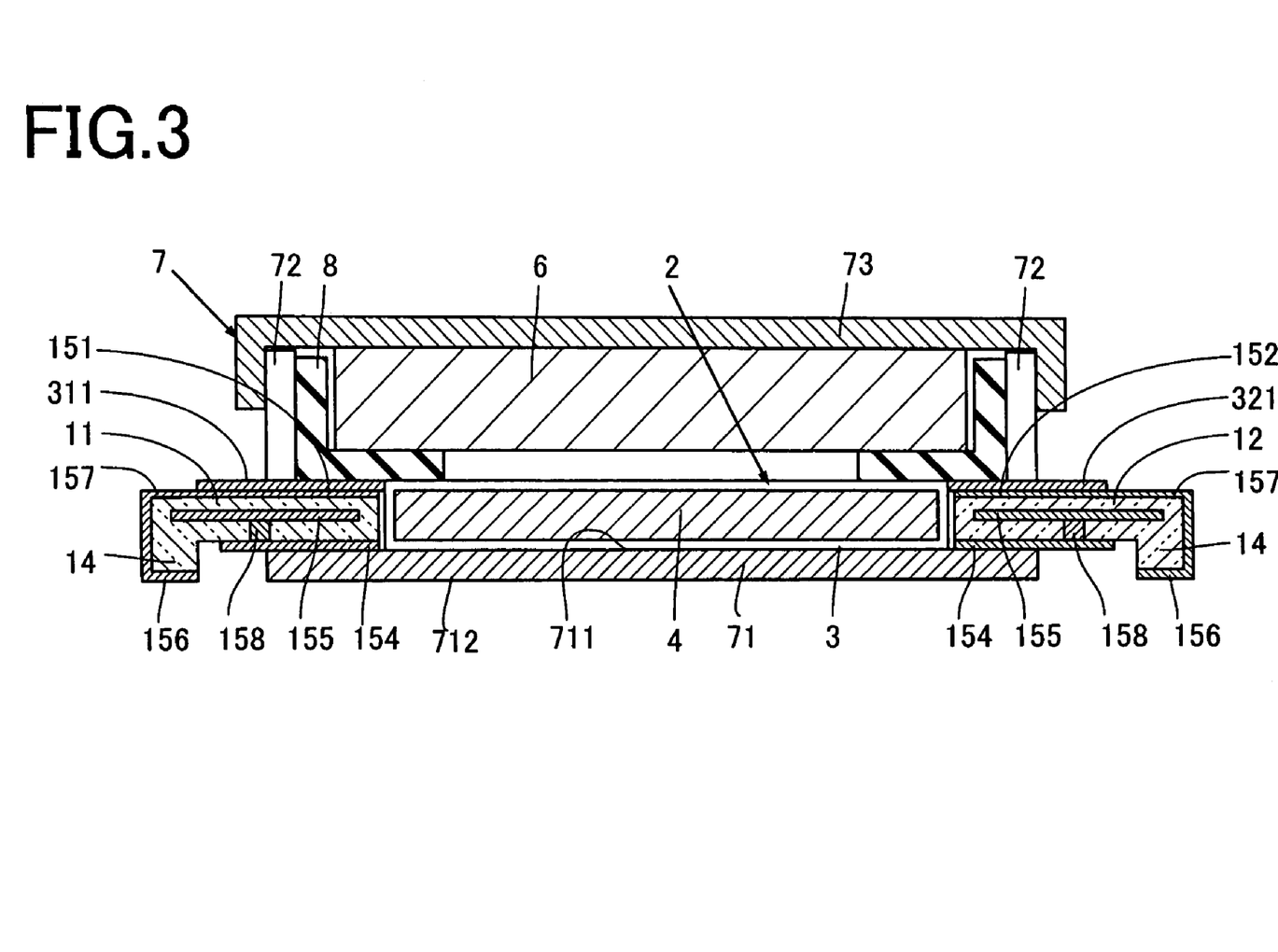
FIG. 3 is a partial sectional view of the non-reciprocal device shown in FIGS. 1 and 2 in an assembled state.
Figure 4:
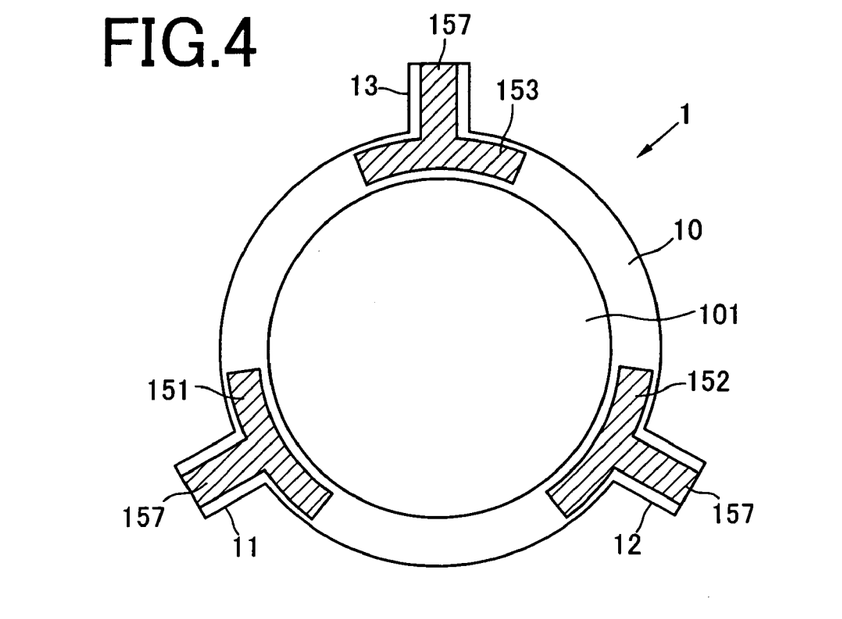
FIG. 4 is a plan view showing an example of a circuit board.
Figure 5:
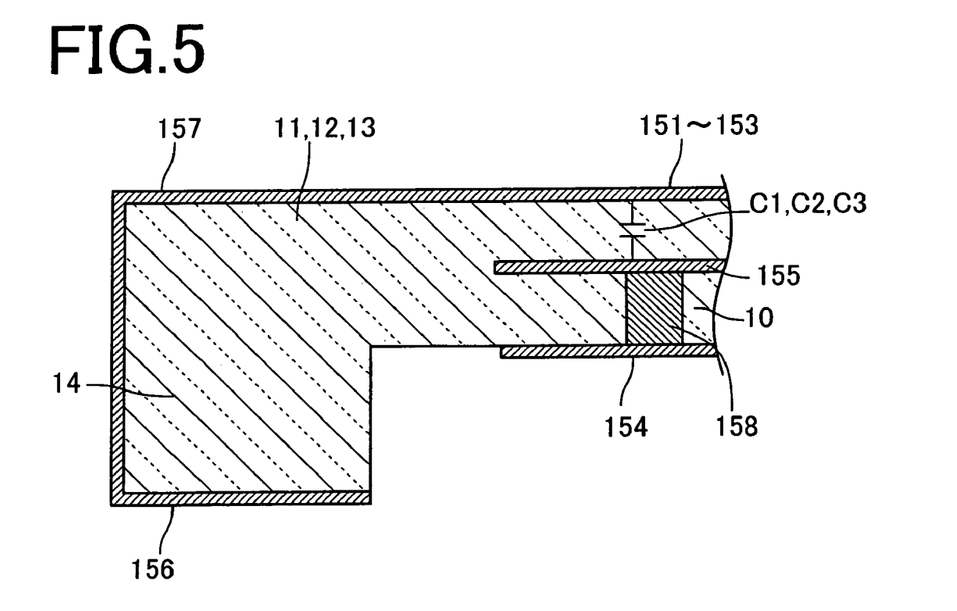
FIG. 5 is a magnified sectional view of an external-terminal forming portion of the circuit board shown in FIG. 4.
Figure 6:
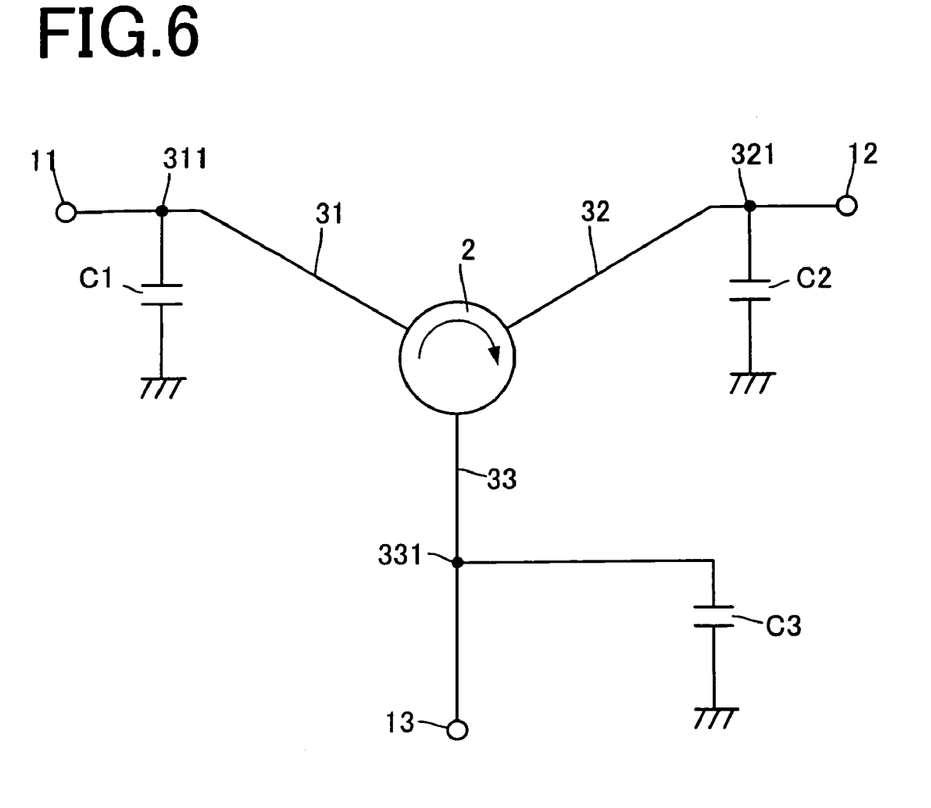
FIG. 6 is a circuit diagram of the non-reciprocal device shown in FIG. 1.

FIG. 1 is a perspective view showing an embodiment of a non-reciprocal device according to the present invention; FIG. 2 is an exploded perspective view showing the non-reciprocal device shown in FIG. 1; FIG. 3 is a partially sectional view of the non-reciprocal device shown in FIGS. 1 and 2 in an assembled state; FIG. 4 is a plan view showing an example of a circuit board to be used in the non-reciprocal device shown in FIGS. 1 and 2; FIG. 5 is a sectional view of a main part of it; and FIG. 6 is a circuit diagram of it. The illustrated embodiment shows an example formed into a circulator.

The non-reciprocal device illustrated comprises a circuit board 1, a gyromagnetic component 2 and a case 7, and further a permanent magnet 6 and a pressing member 8.

The case 7 is in the shape of a cylinder being closed at its upper and lower ends, is formed out of a magnetic metal material having an electric conductivity, and comprises a bottom portion 71, a plurality of side walls (three side walls) 72 and a lid member 73.

The side walls 72 are raised up from the outer circumference of the bottom portion 71 and are arranged with first to third spaces 721 to 723 among one another. The first to third spaces 721 to 723 each have an opening edge on the same plane as the internal surface 711.

The lid member 73 is placed on the side walls 72 to close the upper end of the case 7 and close the upper portions of the first to third spaces 721 to 723. The case 7 has the circuit board 1, the gyromagnetic component 2, the permanent magnet 6 and the pressing member 8 housed in it.

The circuit board 1 comprises a body 10, first to third external-terminal forming portions 11 to 13 and conductor patterns 151 to 157. The body 10 of the illustrated embodiment is in the shape of a circular ring, has a circular through-hole 101 of several millimeters in diameter, and is made to be about 1 mm in thickness.

The first to third external-terminal forming portions 11 to 13 each protrude from the external side surface of the body 10 and have a thick portion 14 thicker than the body 10 at its fore-end. The thick portions 14 are formed so as to protrude downward from the external-terminal forming portions 11 to 13 and have a thickness obtained by adding nearly the same thickness as the bottom portion 71 of the case 7 to the thickness of the body 10. This structure provides an effect of setting the bottom surfaces of the external-terminal forming portions 11 to 13 on the same plane as the outer bottom surface 712 of the case 7 when the circuit board 1 is housed in the case 7.

As shown in FIGS. 4 and 5, the conductor patterns 151 to 157 comprise first to third connection electrodes 151 to 153 for center conductors, grounding electrodes 154 and 155, external terminal electrodes 156, and connection conductors 157. The first to third connection electrodes 151 to 153 for center conductors are respectively formed in the peripheries of the first to third external-terminal forming portions 11 to 13 on the upper surface of the body 10.

The ground electrodes (154, 155) include a first ground electrode 154 and second ground electrodes 155. The first ground electrode 154 is formed all over the lower surface of the body 10. The second ground electrodes 155 are formed inside the circuit board 1 and form first to third capacitors C1 to C3 in portions opposite to the first to third connection conductors 151 to 153 for center conductors. The second ground electrodes 155 each are connected to the first ground electrode 154 through a second connection conductor 158 formed in a via hole, a through hole or the like. Since this structure can secure the capacitances of the first to third capacitors C1 to C3 and further increase the thickness of the circuit board 1, it is effective for enhancing the rigidity and mechanical strength of the circuit board. Therefore, since the degree of freedom of design with regard to the material and thickness of the circuit board 1 is enhanced and the capacitance of a capacitor can be widely selected, it is possible to design a non-reciprocal device adapted to various frequency bands.

The external terminal electrodes 156 are formed over the thick portions 14 that extend from the fore-end surfaces to the lower surfaces of the first to third external-terminal forming portions 11 to 13. The external terminal electrodes 156 are connected to the connection electrodes 151 to 153 for center conductors by the connection conductors 157 formed on the upper surfaces of the external-terminal forming portions 11 to 13.

In the circuit board 1, its lower surface is made to be opposite to the internal surface 711, only the body 10 is housed in the case 7, and the external-terminal forming portions 11 to 13 are respectively led to the outside of the case 7 through the first to third spaces 721 to 723. The first grounding electrode 154 formed on the lower surface of the circuit board 1 is electrically connected to the internal surface 711.

The circuit board 1 can be made by a conventional laminate-printing method and a material to be used in it is not limited in particular. Any of ceramic dielectric, organic dielectric and the like may be used. These are selected in consideration of required electric characteristics, mechanical strength and the like.

The gyromagnetic component 2 comprises a plurality of center conductors 31 to 33, a soft ferrite body 4 and insulating sheets 5. The soft ferrite body 4 is preferably formed out of a soft magnetic material such as yttrium/iron/garnet (YIG) and the like. The soft ferrite body 4 is formed in the shape of a disk of several millimeters in diameter and about 1 mm in thickness, such that the disk can be inserted into a through-hole 101 of the circuit board 1.

The first to third center conductors 31 to 33 are branched from the grounding portion opposite to the lower surface of the soft ferrite body 4 and are formed out of a conductor sheet obtained by blanking a copper sheet of about 30 to 50 $\mu$m in thickness, for example. Although not illustrated, the grounding portion is in the shape of a disk of several millimeters in diameter being nearly the same in size as the disk face of the soft ferrite body 4 and the first to third center conductors 31 to 33 are branched from the circumference of it.

The first to third center conductors 31 to 33 are bent in order on the upper surface 41 of the soft ferrite body 4, intersect one another at specified angles, and are electrically insulated from one another through insulating sheets 5 (see FIG. 2). The fore-ends of the first to third center conductors 31 to 33 form terminal portions 311 to 331 to be connected to the first to third connection electrodes 151 to 153 for center conductors.

The gyromagnetic component 2 is inserted into the through-hole 101 of the circuit board 1 and housed in the case 7, and the grounding portion of the center electrode 3 is electrically connected to the internal surface 711 of the case 7 and the connection terminals 311 to 331 are respectively connected to the first to third connection electrodes 151 to 153 for center conductors.

The pressing member 8 is formed out of an insulating material such as engineering plastics, and has a circular through-hole 80 and a frame portion 81 in the shape of a circular ring. The disk-shaped permanent magnet 6 is placed in the through-hole 80. The pressing member 8 is housed in the case 7 such that the pressing member is placed on the upper surfaces of the circuit board 1 and the gyromagnetic component 2, and presses the circuit board 1 and the gyromagnetic component 2 by means of the frame portion 81 and thereby aligns the circuit board 1, the gyromagnetic component 2 and the permanent magnet 6.

The permanent magnet 6 is arranged so as to be opposite to the gyromagnetic component 2, is magnetically coupled with the lid member 73 placed over the permanent magnet 6, makes the case 7 function as a yoke, and applies a DC magnetic field to the gyromagnetic component 2.

The respective parts are electrically connected with each other by means of a connection means such as soldering and the like, and are connected according to the circuit diagram shown in FIG. 6. In the figure, an isolator can be formed by connecting an optional center conductor, for example, the third center conductor 33 through a terminating resistor to the ground. The terminating resistor can be also formed by being built in the circuit board 1 in the same manner as the first to third capacitors C1 to C3.

Figure 7:
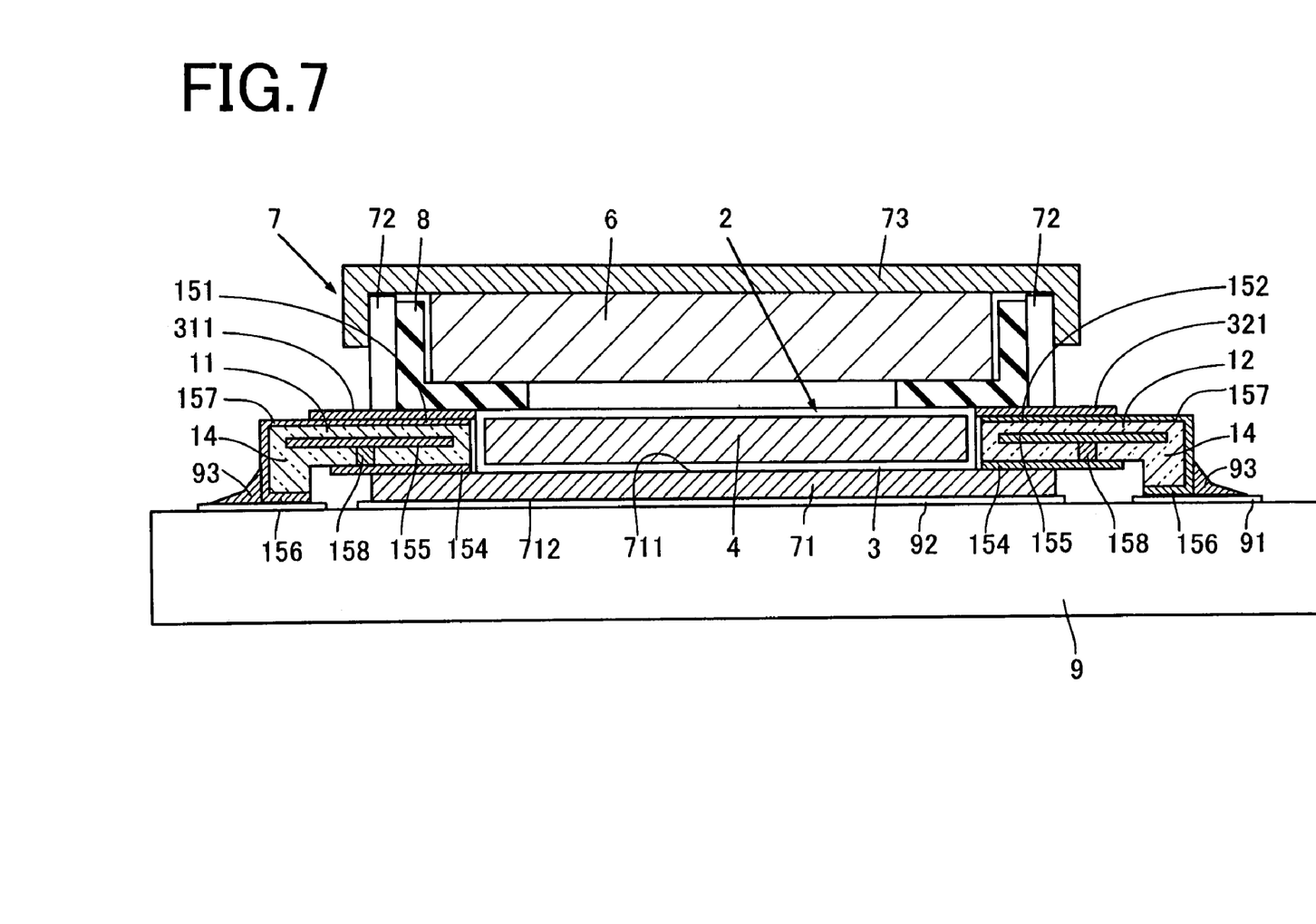
FIG. 7 is a sectional view schematically showing the state where the non-reciprocal device shown in FIG. 1 is surface-mounted on a component-mounting board of a communication device.

FIG. 7 is a sectional view schematically showing the state where a non-reciprocal device described above is surface-mounted on a component-mounting board of a communication device. In the figure, a conductor pattern 91 for signal and a grounding conductor pattern 92 are provided on one surface of the component-mounting board 9.

The non-reciprocal device is mounted by soldering 93 the respective external terminal electrodes 156 onto the conductor patterns 91 and soldering the outer bottom surface 712 of the case 7 onto the grounding conductor pattern 92.

Hereupon, the first to third external-terminal forming portions 11 to 13 are formed including thick portions 14. The thick portions 14 are formed so as to protrude downward from the external-terminal forming portions 11 to 13 and each have a thickness obtained by adding nearly the same thickness as the thickness of the bottom portion 71 of the case 7 to the thickness of the body 10. Therefore, the lower surfaces of the thick portions 14 are formed on the same plane as the outer bottom surface 712 of the case 7. On the thick portions 14 there are formed the external terminal electrodes 156. Consequently, the external terminal electrodes 156 and the outer bottom surface 712 of the case 7 are formed on the same plane, and stable surface-mounting of the non-reciprocal device is achieved. The same planarity in the base surfaces of the external terminal electrodes 156 and the outer bottom surface 712 of the case 7 is easily secured by controlling only the thickness tolerances of the case bottom portion 71 and the circuit board 1.

In this embodiment, only the circuit board 1 is required as an additional component. Accordingly, reduction in the number of components, improvement in the yield of assembly, and reduction in the man-hour and cost for assembly are achieved.

In the circuit board 1 of this embodiment, the first to third capacitors C1 to C3 are formed by utilizing the first to third connection electrodes 151 to 153 for center conductors and the second grounding electrodes 155 that is in an intermediate layer of the circuit board 1. Therefore, it is possible to secure the capacitances of the capacitors and increase the thickness of the circuit board 1. Consequently, the circuit board 1 is fabricated to have high rigidity, so that the external-terminal forming portions of the circuit board has high mechanical strength. This reduces the risk of the external terminals deformed by mechanical stress in manufacturing, carrying, handling and mounting the non-reciprocal device. Also, this point is effective for securing the same planarity in the bottom surfaces of the external terminals 156 and the case bottom surface 712.

And, since the connection terminal portions 311 to 331 of the first to third center conductors 31 to 33 are arranged inside the case 7 and far from the external terminal electrodes 156, there is an advantage of avoiding the mechanical stress transmission to the connection portions of the center conductor. Consequently, an external-terminal structure with high mechanical strength and reliable connection to the center conductor is obtained.

Figure 8:
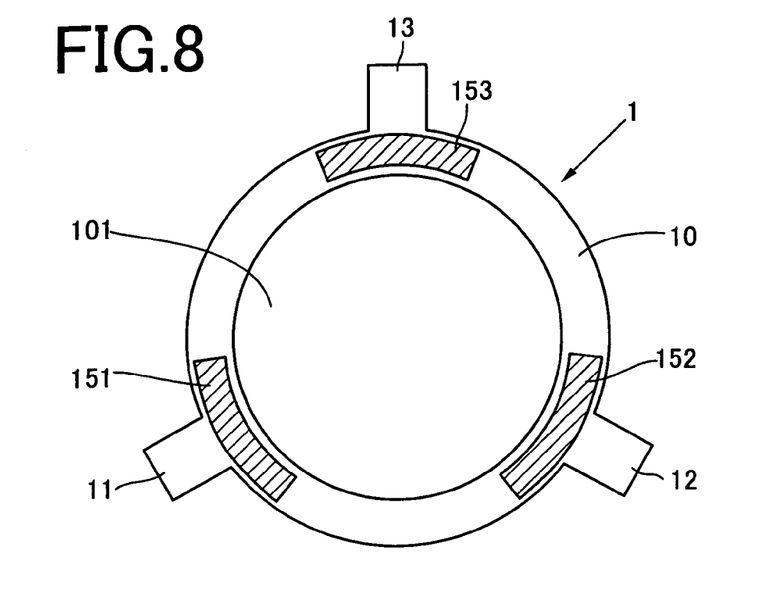
FIG. 8 is a plan view showing another embodiment of a circuit board to be used in a non-reciprocal device.
Figure 9:
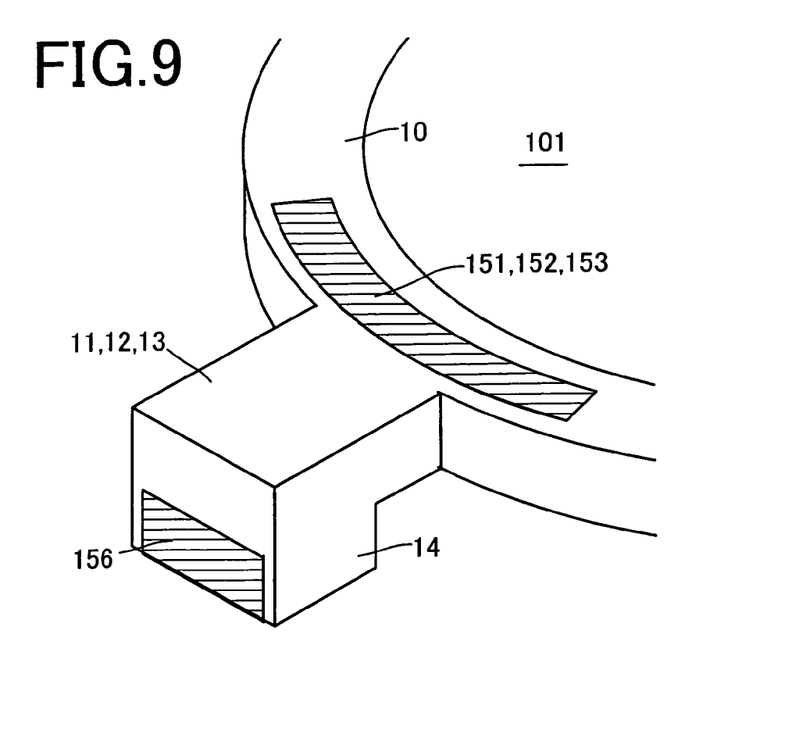
FIG. 9 is a magnified perspective view of an external-terminal forming portion of the circuit board shown in FIG. 8.
Figure 10:
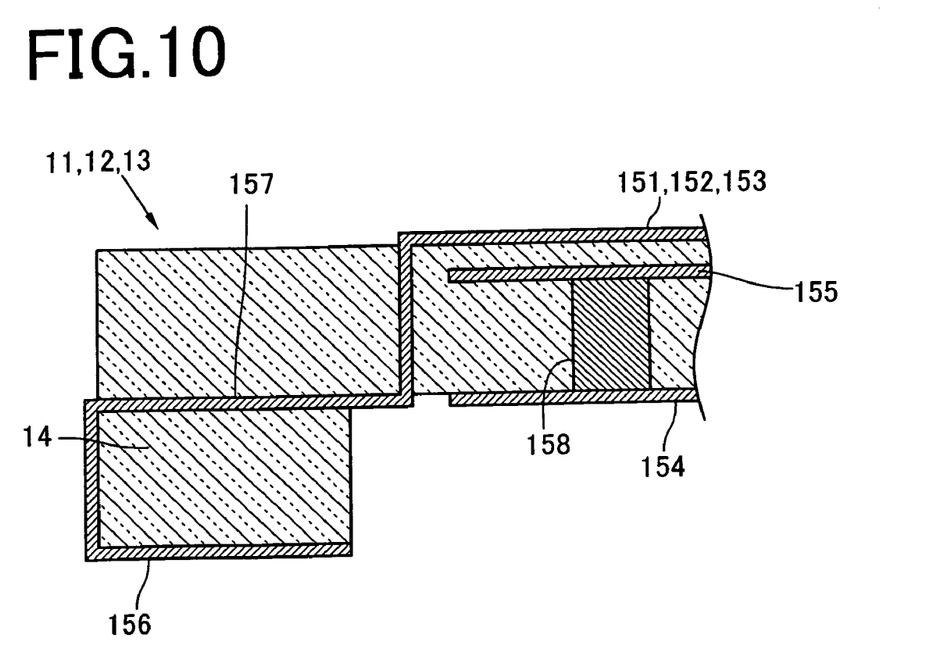
FIG. 10 is a magnified sectional view of the external-terminal forming portion of the circuit board shown in FIG. 8.

FIG. 8 is a plan view showing another embodiment of a circuit board 1 to be used in the non-reciprocal device shown in FIG. 1; FIG. 9 is a magnified perspective view of an external-terminal forming portion of the circuit board shown in FIG. 8; and FIG. 10 is a magnified sectional view of the external-terminal forming portion of the circuit board shown in FIG. 8.

In the illustrated embodiment, the first to third connection electrodes 151 to 153 for center conductors are respectively formed in the peripheries of the external-terminal forming portions 11 to 13 on the upper surface of the body 10.

The external terminal electrodes 156 are formed on the thick portions 14 spreading from the lower halves of the fore-end surfaces to the lower surfaces of the first to third external-terminal forming portions 11 to 13. The connection conductors 157 are formed inside the first to third external-terminal forming portions 11 to 13. The external terminal electrodes 156 are connected to the connection electrodes 151 to 153 for center conductors by the connection conductors 157.

A non-reciprocal device using a circuit board 1 of this embodiment provides a similar action and effect to the non-reciprocal device shown in FIGS. 1 to 7 and further has an advantage of being less influenced by stray capacity and the like due to less exposure of connection conductors 157 and being high in reproducibility of the electric characteristics of it when being mounted on a communication device.

Figure 11:
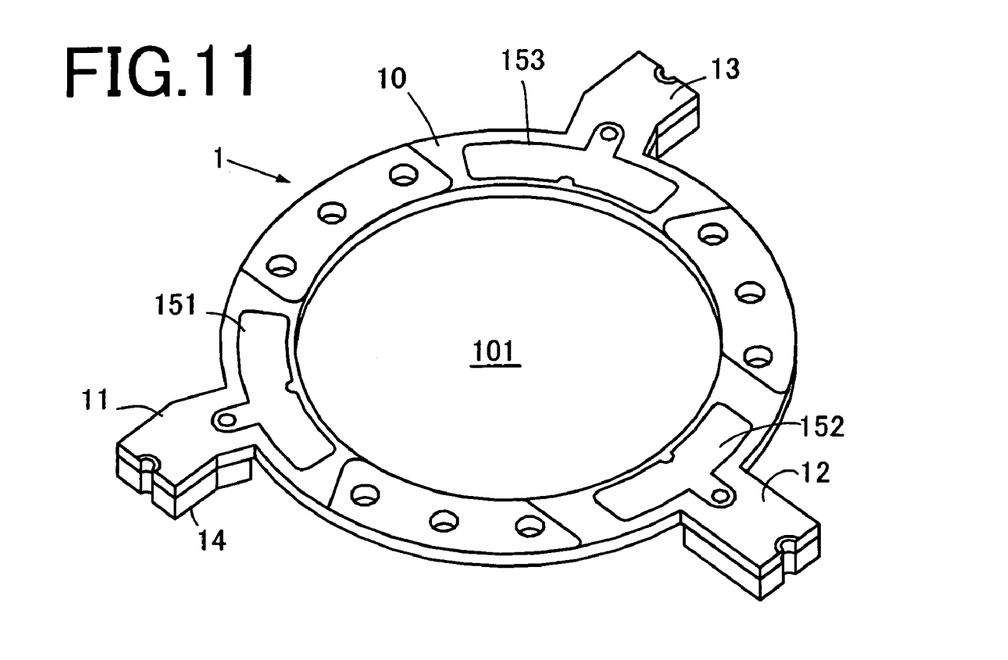
FIG. 11 is a perspective view showing a still another embodiment of a circuit board.
Figure 12:
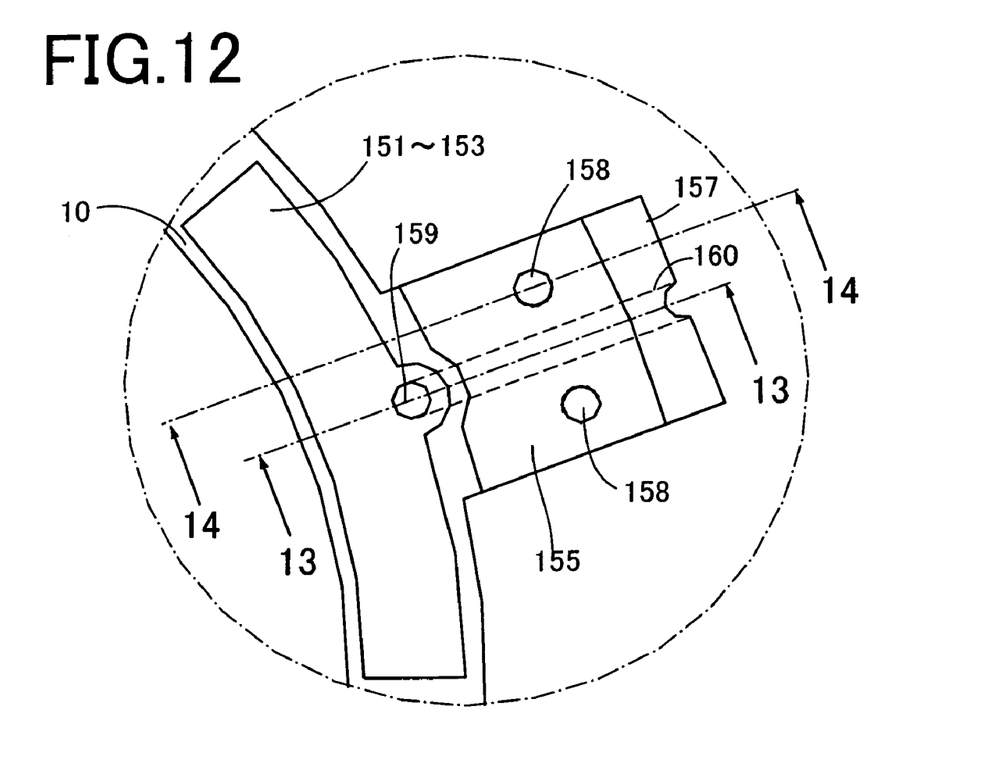
FIG. 12 is a magnified view showing an external-terminal forming portion of the circuit board shown in FIG. 11.
Figure 13:
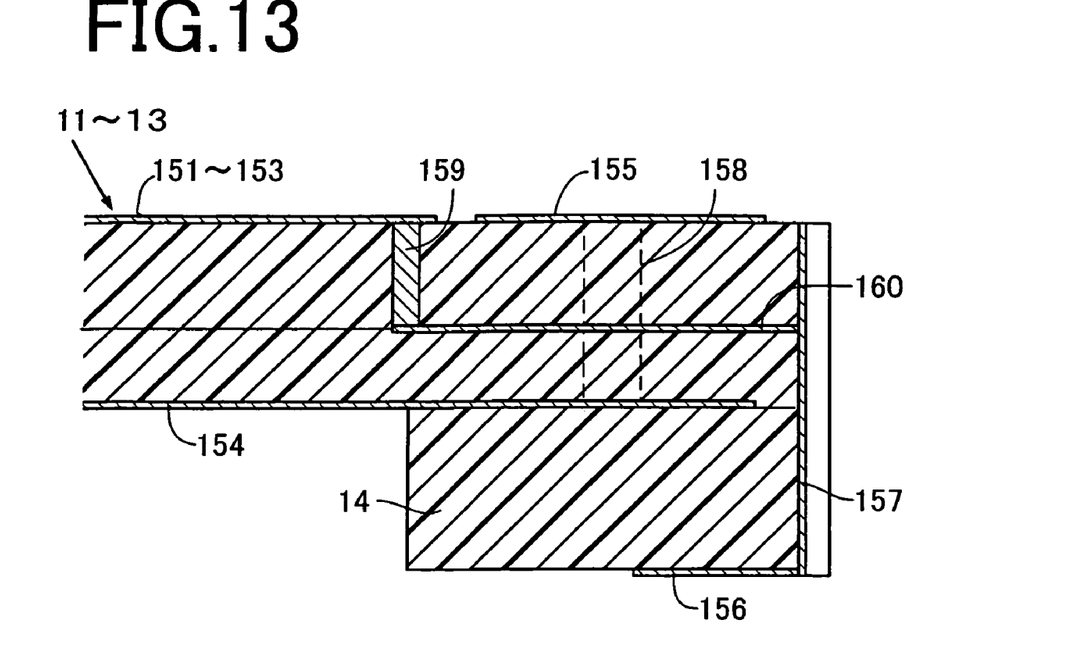
FIG. 13 is a magnified sectional view taken along line 13—13 of FIG. 12.
Figure 14:
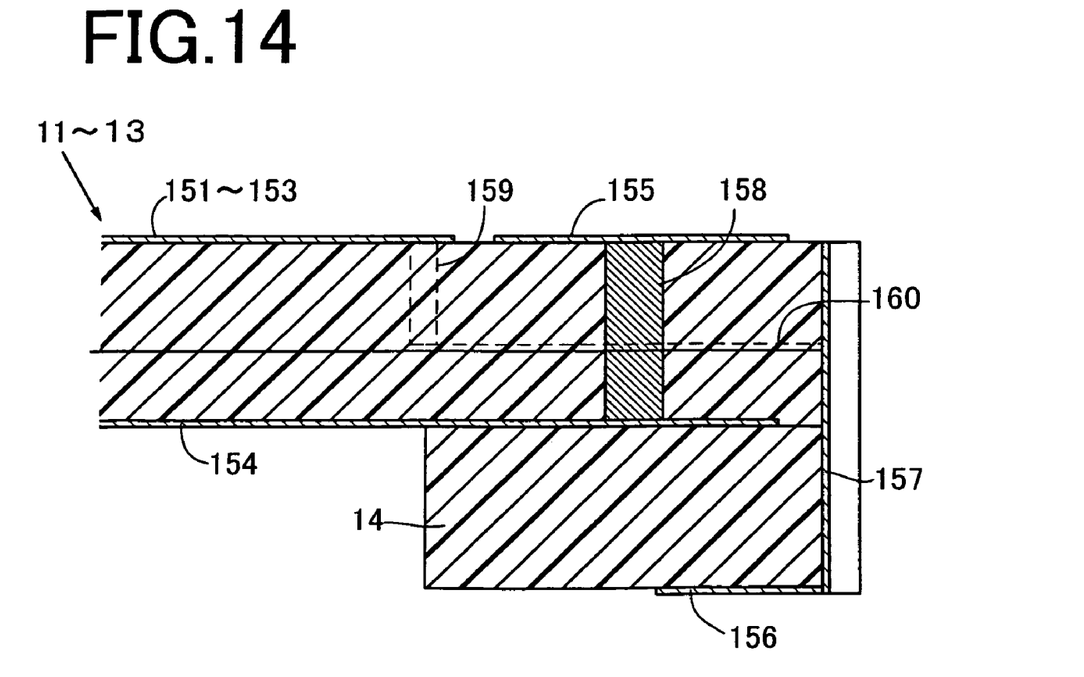
FIG. 14 is a magnified sectional view taken along line 14—14 of FIG. 12.

FIG. 11 is a perspective view showing a still another embodiment of a circuit board; FIG. 12 is a magnified view of an end portion of the circuit board shown in FIG. 11; FIG. 13 is a magnified sectional view taken along line 13—13 of FIG. 12; and FIG. 14 is a magnified sectional view taken along line 14—14 of FIG. 12.

In the circuit board 1 of the illustrated embodiment, first to third connection electrodes 151 to 153 for center conductors are formed in the peripheries of the external-terminal forming portions 11 to 13 on the upper surface of the body 10. The body 10 is preferably formed by stacking organic dielectric boards one over another.

Capacitive electrodes 160 are provided inside the external-terminal forming portions 11 to 13. One-side ends of the capacitive electrodes 160 are respectively connected by penetrating conductors 159 with the first to third connection electrodes 151 to 153 for center conductors. The other-side ends of the capacitive electrodes 160 are connected to connection conductors 157 formed on the fore-end surfaces of the first to third external-terminal forming portions 11 to 13. The connection conductors 157 extend over the fore-end surfaces of the first to third external-terminal forming portions 11 to 13 and are connected to external electrodes 156 formed on the lower surfaces of thick portions 14. Therefore, the external terminal electrodes 156 respectively result in being electrically connected to the first to third connection electrodes 151 to 153 for center conductors through the connection conductors 157, the capacitive electrodes 160 and the penetrating conductors 159.

On the other hand, second grounding electrodes 155 are formed being distant by certain spaces from the external-terminal forming portions 11 to 13 at the respective fore-end sides of the external-terminal forming portions 11 to 13. And a first grounding electrode 154 is formed all over the lower surface of the body 10. This first grounding electrode 154 is extended to positions opposite to the capacitive electrodes 160 inside the external-terminal forming portions 11 to 13 and forms first to third capacitors C1 to C3 in portions opposite to the capacitive electrodes 160 (see FIG. 6).

The first grounding electrode 154 is connected to the second grounding electrodes 155 by second connection conductors 158 formed in via holes, through holes and the like. As described above, since this structure can secure the capacitances of the first to third capacitors C1 to C3 and further increase the thickness of the circuit board 1, it is effective for enhancing the rigidity and mechanical strength of the circuit board.

A non-reciprocal device using a circuit board 1 according to this embodiment can provide a similar action and effect to the non-reciprocal device shown in FIGS. 1 to 7.

Figure 15:
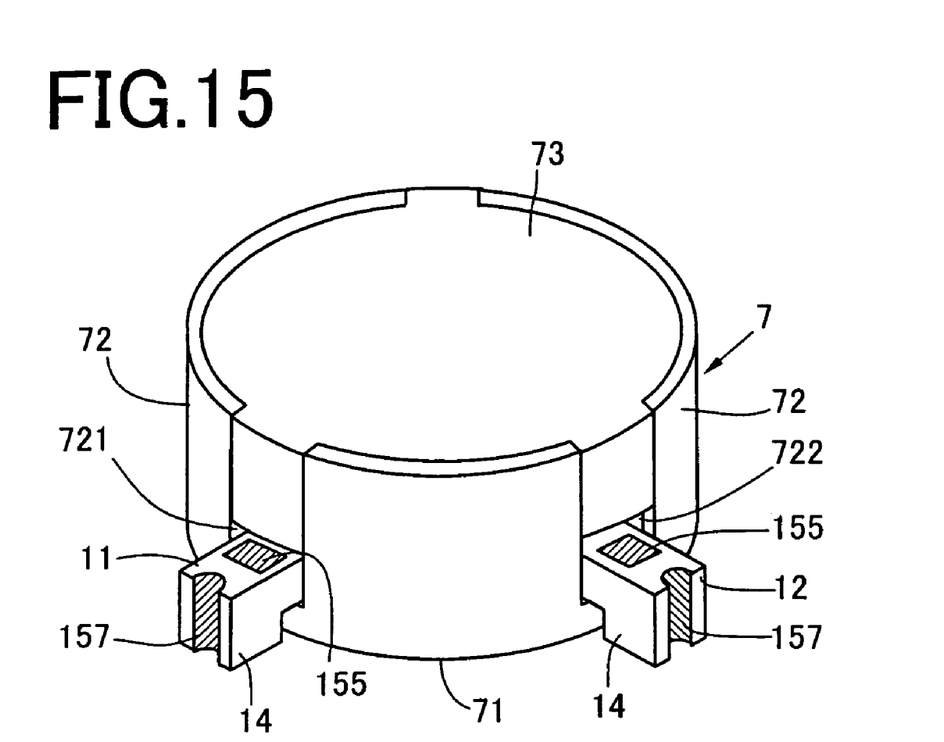
FIG. 15 is a perspective view showing another embodiment of a non-reciprocal device according to the present invention.
Figure 16:
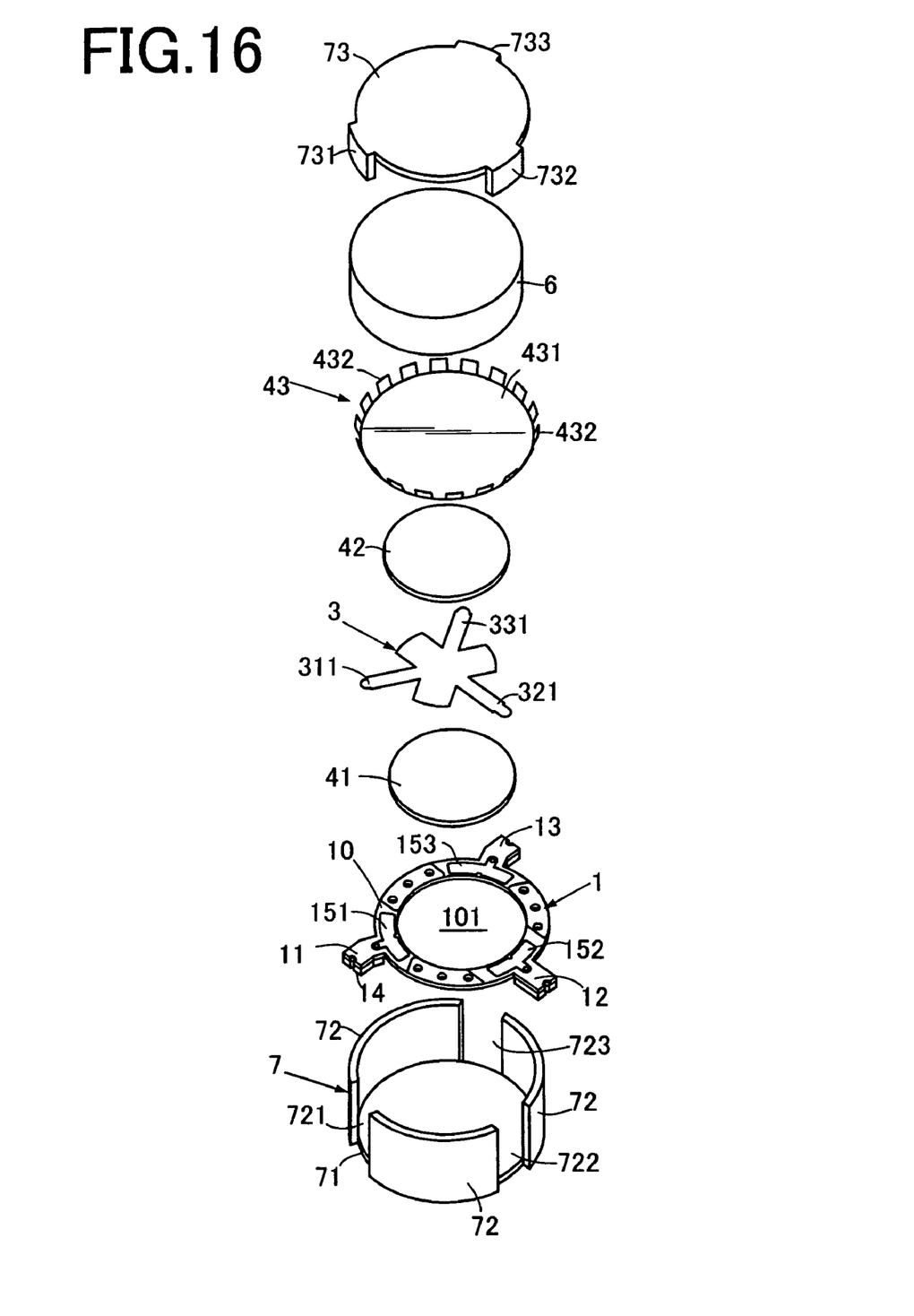
FIG. 16 is an exploded perspective view of the non-reciprocal device shown in FIG. 15.

FIG. 15 is a perspective view showing an embodiment of a non-reciprocal device according to the present invention; and FIG. 16 is an exploded perspective view of the non-reciprocal device shown in FIG. 15. The illustrated embodiment shows an example formed into a circulator. In the figure, portions corresponding to the structural portions shown in the figures previously shown are given the same reference symbols.

In this embodiment, a center conductor 3 is of a distributed constant type, and is formed out of a sheet of non-magnetic metal such as copper and the like. The center conductor 3 has three connection terminals 311 to 331 protruding from its outer circumference.

Soft ferrite bodies 41 and 42 made of ferrite are arranged at both sides of the center conductor 3. The soft ferrite body 41 is placed in a through-hole 101 of a circuit board 1. One face of the soft ferrite body 42 is stacked on a surface of the center conductor 3 and the other face has a grounding shield 43 stacked on it.

The grounding shield 43 is obtained by working a non-magnetic metal plate of copper or the like, and acts a grounding electrode for exposed parts of the center conductor 3. Therefore, the grounding shield 43 is determined in outer diameter so as to cover the connection electrodes 311 to 331 of the center conductor 3. The grounding shield 43 has separate projecting pieces 432 bent along its circumferential edge on the face opposite to a face of a body 431 being in contact with the soft ferrite body 42. A permanent magnet 6 for applying a DC magnetic field to the soft ferrite bodies 41 and 42 is placed on a body 431 surrounded by the separate projecting pieces 432. In case that the permanent magnet 6 is formed out of an electrically conductive magnetic material, for example, a metal magnet, the grounding shield 43 can be omitted.

In the embodiment, although the circuit board 1 having only capacitors built in it is illustrated as an example, it can easily lay out a transmission path or a grounding electrode and can also have inductors, resistors and the like built in it. Due to this, it is possible to form a non-reciprocal device having part or all of an additive circuit such as an impedance matching circuit, a monitor output circuit and the like built in it.

As the circuit board 1, there can be used a circuit board illustrated above as an example. The circuit board 1 may be in the shape of a square or the like in addition to a circular ring, and may select an optional shape being fitted with the whole shape of a non-reciprocal device, or may be in the shape of a plate other than a ring.

Further, a non-reciprocal device forming no built-in components in a circuit board 1 but mounting components on the circuit board 1 can also enjoy advantages of the present invention.

Although the present invention has been described in detail with reference to the preferred embodiments, the present invention is not limited to these embodiments but it is self-evident that those who are in this technical field can hit upon various variation examples on the basis of its fundamental technical idea and teachings.

What is claimed is:

1. A non-reciprocal device comprising a gyromagnetic component, a case and a circuit board, wherein:
   the gyromagnetic component comprises a soft ferrite body and a center conductor, the center conductor including a plurality of terminal portions and combined with the soft ferrite body;
   the case comprises a bottom portion and a plurality of side walls, the side walls arranged with a space therebetween on the periphery of the bottom portion;
   the circuit board comprising;
      a body having a through-hole;
      a plurality of external-terminal forming portions, each external-terminal forming portion protruding from the external side surface of the body and having a thick portion thicker than the body at the fore-end of the external-terminal forming portion;
      a plurality of conductor patterns, each conductor pattern including a connection electrode for center conductor, the connection electrode formed on the upper surface of the body, an external terminal electrode formed on the surface of said thick portion, and a connection conductor connecting the connection electrode for center conductor and the external terminal electrode to each other;
   the circuit board is placed inside the case so that the lower surface of the body of the circuit board is opposite to the internal surface of the bottom portion of the case and the external-terminal forming portions of the circuit board are led to the outside of the case through said spaces; and
   the gyromagnetic component is placed in the through-hole of the circuit board, the terminal portions of the center conductor being individually connected to the respective connection electrodes for center conductor.

2. The non-reciprocal device of claim 1, wherein:
   the circuit board has a plurality of capacitors built in it.

3. The non-reciprocal device of claim 2, further comprising a first grounding electrode and a second grounding electrode, wherein:
   the first grounding electrode is formed on the lower surface of the body of the circuit board;
   the second grounding electrode is embedded in the body;
   the first grounding electrode and the second grounding electrode are electrically connected to each other; and
   the capacitors are formed by the connection electrodes for center conductor and the second grounding electrode.

4. The non-reciprocal device of claim 1, wherein;
   the external terminal electrode is formed extending from the fore-end surface of the external-terminal forming portion, to the bottom surface of the external-terminal forming portion; and
   the connection conductor is formed on the surface of the external-terminal forming portion.

5. The non-reciprocal device of claim 1, wherein;
   the external terminal electrode is formed extending from the lower half of the fore-end surface of the external-terminal forming portion, to the bottom surface of the external-terminal forming portion;
   the connection conductor comprises;
      a first connection conductor formed inside the external-terminal forming portion; and
      a second connection conductor formed passing through the body and connected to the first connection conductor.

6. The non-reciprocal device of claim 1, wherein;
   the external terminal electrode is formed extending from the fore-end surface of the external-terminal forming portion, through the bottom surface of the external-terminal forming portion, to the internal end surface of the external-terminal forming portion; and
   the connection conductor is formed passing through the body.

* * * * *